(12) United States Patent
Higashiyama

(10) Patent No.: US 11,990,371 B2
(45) Date of Patent: May 21, 2024

(54) DEVICE CHIP MANUFACTURING METHOD

(71) Applicant: DISCO CORPORATION, Tokyo (JP)

(72) Inventor: Kazuki Higashiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 400 days.

(21) Appl. No.: 17/447,592

(22) Filed: Sep. 14, 2021

(65) Prior Publication Data
US 2022/0093464 A1 Mar. 24, 2022

(30) Foreign Application Priority Data

Sep. 24, 2020 (JP) .................. 2020-159285

(51) Int. Cl.
| | |
|---|---|
| *H01L 21/78* | (2006.01) |
| *H01L 21/3065* | (2006.01) |
| *H01L 21/027* | (2006.01) |
| *H01L 21/308* | (2006.01) |
| *H01L 21/311* | (2006.01) |
| *H01L 21/66* | (2006.01) |

(52) U.S. Cl.
CPC ........ *H01L 21/78* (2013.01); *H01L 21/30655* (2013.01); *H01L 21/0275* (2013.01); *H01L 21/3081* (2013.01); *H01L 21/31127* (2013.01); *H01L 22/34* (2013.01)

(58) Field of Classification Search
CPC ............... H01L 21/78; H01L 21/30655; H01L 21/0275; H01L 21/3081; H01L 21/31127; H01L 22/34
See application file for complete search history.

(56) References Cited

U.S. PATENT DOCUMENTS

| | | | | |
|---|---|---|---|---|
| 9,861,710 | B1* | 1/2018 | Ruckh | ...................... A61B 5/05 |
| 2005/0009307 | A1* | 1/2005 | Shigematsu | ...... H01L 21/31105 |
| | | | | 257/E23.179 |
| 2014/0141596 | A1* | 5/2014 | Matsuzaki | ............. B23K 26/40 |
| | | | | 438/462 |
| 2015/0262908 | A1* | 9/2015 | Ancey | ................... F28D 15/046 |
| | | | | 438/584 |

FOREIGN PATENT DOCUMENTS

| | | |
|---|---|---|
| JP | 2014107283 A | 6/2014 |
| JP | 2020102588 A | 7/2020 |

* cited by examiner

*Primary Examiner* — Samuel A Gebremariam
(74) *Attorney, Agent, or Firm* — Greer Burns & Crain Ltd.

(57) ABSTRACT

A device chip manufacturing method for dividing a silicon wafer formed with devices in each of regions of a front surface partitioned by a plurality of streets includes coating the front surface of the silicon wafer with a resist film, exposing the silicon wafer by removing the resist film in regions along the streets, forming deep grooves by alternately repeating isotropic etching and coating with a passivation film, and subjecting bottom portions of the deep grooves to anisotropic etching to form division grooves, thereby dividing the silicon wafer.

4 Claims, 6 Drawing Sheets

DEVICE CHIP MANUFACTURING METHOD

BACKGROUND OF THE INVENTION

Field of the Invention

The present invention relates to a device chip manufacturing method for dividing a silicon wafer formed on a front surface with a plurality of devices by plasma etching to manufacture individual device chips.

Description of the Related Art

In a manufacturing process for device chips to be incorporated in electronic equipment, first, mutually intersecting streets are set on a front surface of a silicon wafer. Next, devices such as integrated circuits (IC) or large scale integration (LSI) circuits are formed in each of regions partitioned by the streets. Thereafter, the silicon wafer is divided along the streets to individualize the device chips. Conventionally, division of the silicon wafer has been carried out by cutting the silicon wafer by a cutting blade including an annular grindstone section. However, in recent years, the material of a laminated film provided on the front surface of the silicon wafer in forming devices has been diversified, and a partial material constituting the laminated film may be brittle. When the silicon wafer is divided along the streets by the cutting blade, the brittle laminated film may be peeled, and the peeling of the laminated film progresses even to the regions where the devices are formed, possibly breaking the devices.

In view of this, a technology of subjecting the silicon wafer to plasma etching in regions along the streets to thereby divide the silicon wafer has been known (see, for example, Japanese Patent Laid-open No. 2014-107283 and Japanese Patent Laid-open No. 2020-102588). In this technology, a resist film is formed on a front surface or a back surface of a silicon wafer, and the resist film is partially removed (patterned) to expose the silicon wafer along the streets. Thereafter, an etchant gas is plasmatized and made to act on the exposed parts of the silicon wafer, thereby forming division grooves in the silicon wafer.

SUMMARY OF THE INVENTION

The step of dividing the silicon wafer by plasma etching is carried out by what is generally called a Bosch process. In other words, an etching step of forming grooves along the streets by isotropic etching to dig deeper the grooves and a protective film forming step of forming a passivation film (protective film) on inner walls of the formed grooves are repeated, to form division grooves reaching a bottom portion of the wafer. Here, it is confirmed that, at a bottom surface of the silicon wafer formed with the division grooves by the Bosch process, a defect called chipping tends to be easily formed at edges of the division grooves. The chipping is formed by the isotropic etching by which the bottom surface of the silicon wafer is dug through at the final stage of the Bosch process. The chipping is left at an edge of a bottom surface of the device chip formed by division of the silicon wafer, causing a lowering in the quality of the device chips.

Accordingly, it is an object of the present invention to provide a device chip manufacturing method with which it is ensured that when a silicon wafer is divided by plasma etching to form device chips, chipping is not left at edges of the device chips.

In accordance with an aspect of the present invention, there is provided a device chip manufacturing method for dividing a silicon wafer formed with devices in each of regions of a front surface partitioned by a plurality of mutually intersecting streets, into individual device chips. The device chip manufacturing method includes a resist film coating step of coating the front surface of the silicon wafer with a resist film, an exposing step of removing the resist film in regions along the streets to expose the silicon wafer, a silicon wafer conveying-in step of conveying the silicon wafer into a plasma etching apparatus, a deep groove forming step of alternately repeating isotropic etching using a plasma of a $CF_4$ gas or an $SF_6$ gas and coating of regions exposed by the isotropic etching with a passivation film by use of a plasma of a $C_4F_8$ gas to process the silicon wafer along the streets, thereby forming deep grooves not reaching a back surface of the silicon wafer, and a dividing step of subjecting bottom portions of the deep grooves to anisotropic etching by use of a plasma of a mixed gas of $SF_6$ and $O_2$ to form division grooves reaching the back surface of the silicon wafer, thereby dividing the silicon wafer into the individual device chips.

Preferably, the resist film is a water-soluble resin containing polyvinyl alcohol.

In addition, preferably, a test element group (TEG) and an insulating film overlapping with the streets are formed on the front surface of the silicon wafer, and, in the exposing step, a laser beam is applied to remove the resist film, the TEG, and the insulating film in regions overlapping with the streets.

Alternatively, preferably, a TEG and an insulating film overlapping with the streets are formed on the front surface of the streets, and, in the exposing step, the resist film, the TEG, and the insulating film are removed in regions overlapping with the streets by use of a cutting blade.

In the device chip manufacturing method according to an aspect of the present invention, isotropic etching and coating of the regions exposed by the isotropic etching with a passivation film are alternately repeated, to form the silicon wafer with deep grooves not reaching the back surface of the silicon wafer. Thereafter, bottom portions of the deep grooves are subjected to anisotropic etching to form division grooves reaching the back surface of the silicon wafer, thereby dividing the silicon wafer into individual device chips. In this case, the plasma etching carried out when digging through the back surface of the silicon wafer is not isotropic etching but anisotropic etching. At edges of the division grooves at the bottom surface of the silicon wafer, chipping arising from the isotropic etching is not formed. Therefore, chipping is not left at edges of bottom surfaces of the individual device chips formed by division of the silicon wafer, and the quality of the device chips is not lowered.

For this reason, according to the present invention, there is provided a device chip manufacturing method with which it is ensured that when dividing a silicon wafer by plasma etching to form device chips, chipping is not left at edges of the device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described referring to the attached drawings. A device chip manufacturing method according to the present embodiment divides a silicon wafer formed with a plurality of devices on a front surface thereof by plasma etching, to manufacture device chips.

Figure 1:
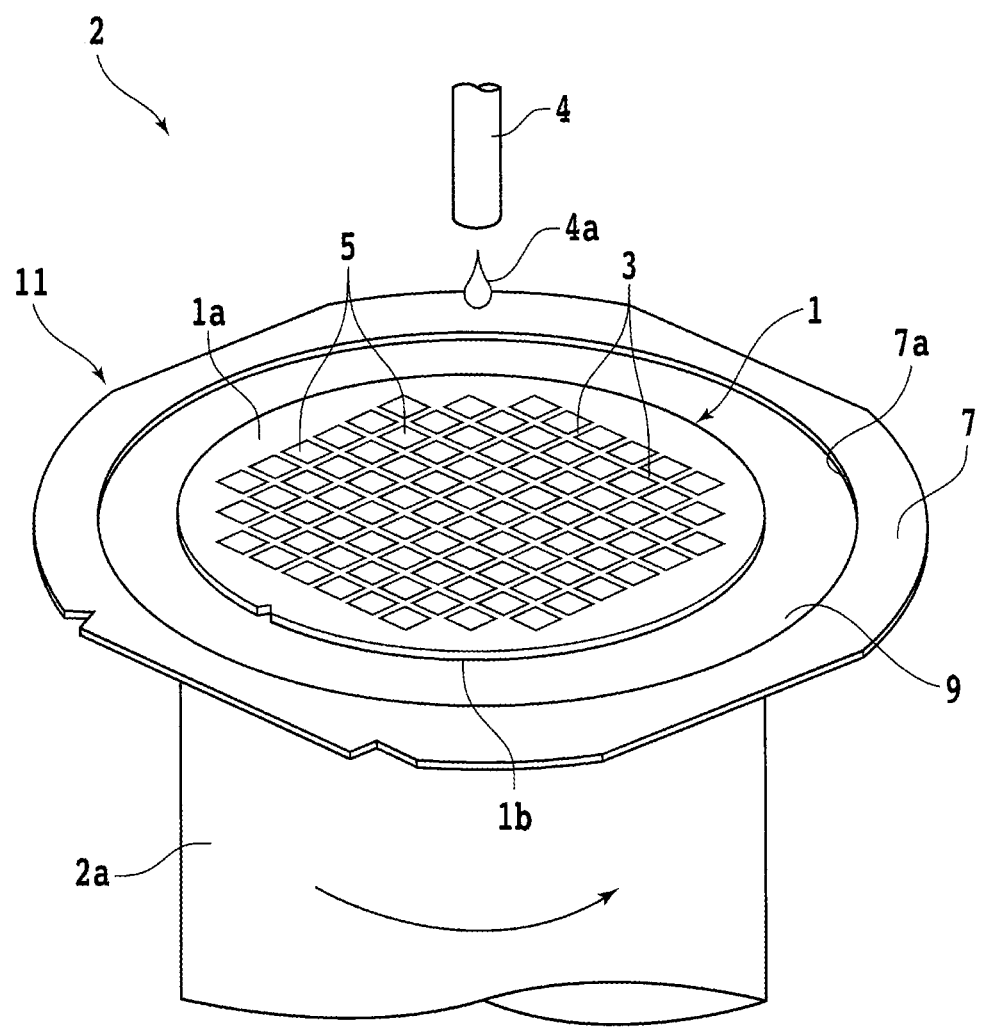
FIG. 1 is a perspective view schematically depicting a resist film coating step.

FIG. 1 includes a perspective view schematically depicting a frame unit 11 that includes a silicon wafer 1 to be processed by the device chip manufacturing method according to the present embodiment. First, the silicon wafer 1 as a workpiece will be described. The silicon wafer 1 is, for example, a substantially disk-shaped wafer including single crystal silicon. A plurality of mutually intersecting streets 3 are set on a front surface 1a of the silicon wafer 1. Devices 5 such as an ICs or LSI circuits are formed in each of regions of the front surface 1a of the silicon wafer 1 partitioned by the streets 3. In the device chip manufacturing method according to the present embodiment, the silicon wafer 1 is divided along the streets 3 by plasma etching, to form individual device chips with the devices 5 mounted thereon. Between the adjacent devices 5 on the front surface 1a of the silicon wafer 1, an insulating film or a wiring layer used for the devices 5 may be formed, and a TEG may be formed. In dividing the silicon wafer 1, these structures need to be cut together with the silicon wafer 1.

Before being divided, the silicon wafer 1 is preliminarily attached to a sheet 9 closing an opening 7a of an annular frame 7. The sheet 9 is, for example, a pressure sensitive adhesive tape having a diameter larger than a diameter of the silicon wafer 1, and a pressure sensitive adhesive surface of the sheet 9 is attached to a back surface 1b of the silicon wafer 1. The material of the sheet 9 is not particularly limited, insofar as the material has resistance to plasma etching described later. The annular frame 7 formed of metal or the like is attached to an outer periphery portion of the sheet 9. In this way, the silicon wafer 1 is integrated with the sheet 9 and the annular frame 7, to form the frame unit 11. When the frame unit 11 is formed, the silicon wafer 1 can be handled through the sheet 9 and the annular frame 7 in the later steps, so that the silicon wafer 1 becomes easy to handle. In addition, the individual device chips formed by dividing the silicon wafer 1 are supported by the annular frame 7 through the sheet 9, so that the device chips are also easy to handle.

Figure 6:
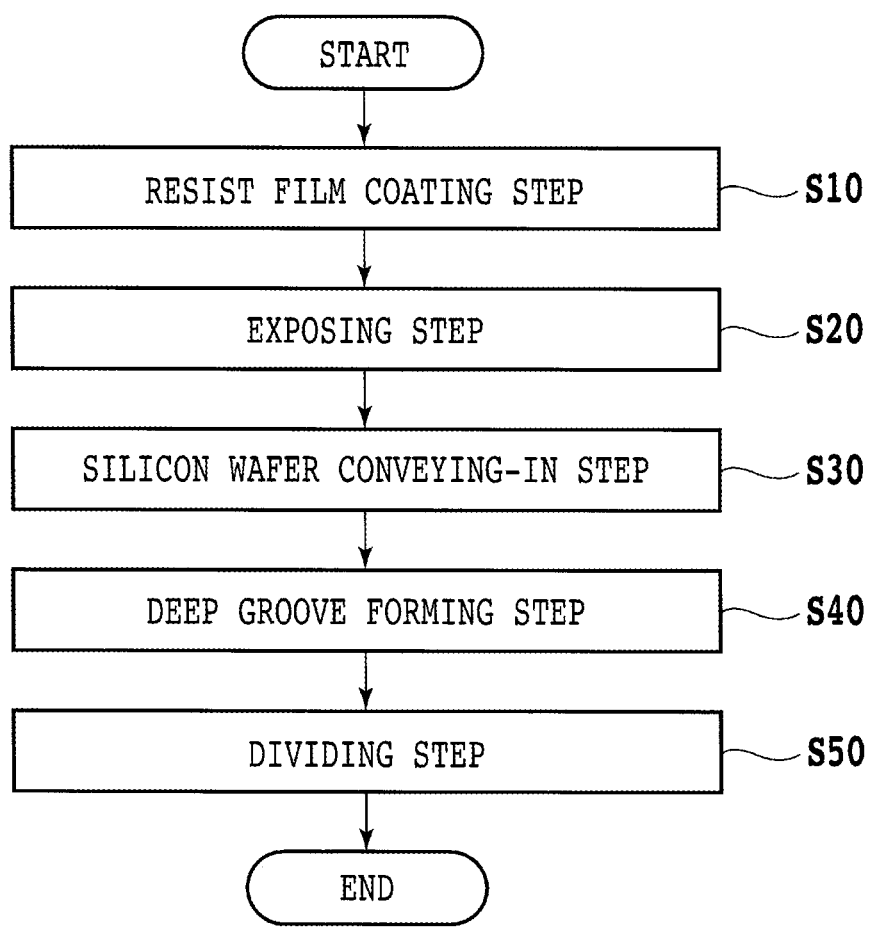
FIG. 6 is a flow chart for explaining the flow of steps of a device chip manufacturing method according to an embodiment of the present invention.

Next, each of steps of the device chip manufacturing method according to the present embodiment will be described. FIG. 6 is a flow chart depicting the flow of the steps of the device chip manufacturing method according to the present embodiment.

Figure 2:
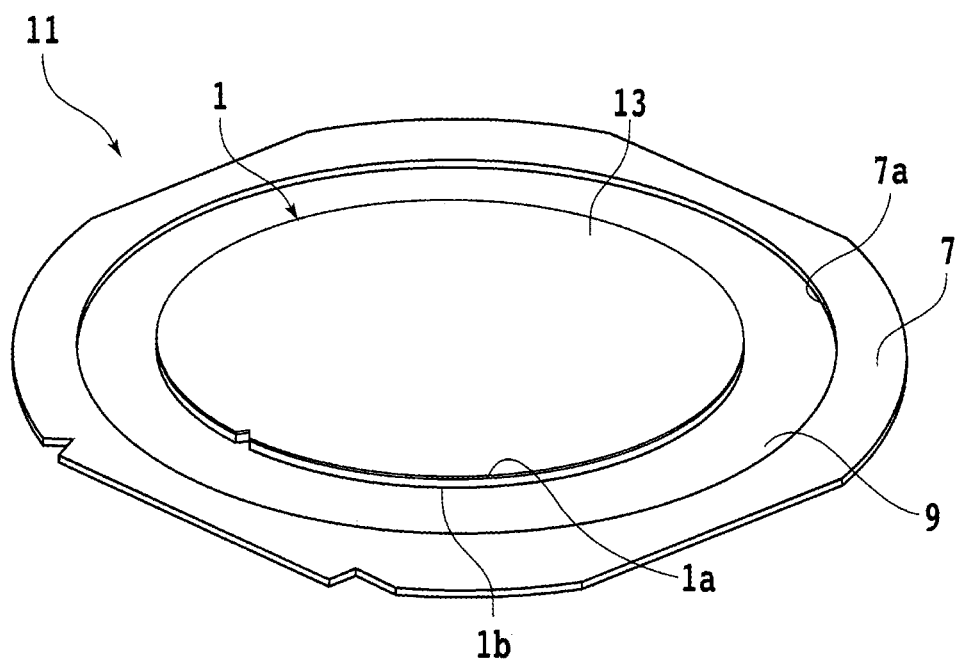
FIG. 2 is a perspective view schematically depicting a silicon wafer coated with a resist film.

In the device chip manufacturing method according to the present embodiment, first, a resist film coating step S10 in which the front surface 1a of the silicon wafer 1 is coated with a resist film is carried out. FIG. 1 is a perspective view schematically depicting the resist film coating step S10. FIG. 2 is a perspective view schematically depicting the frame unit 11 including the silicon wafer 1 coated with a resist film 13. In the resist film coating step S10, for example, a liquid resin as a material of the resist film 13 is applied to the front surface 1a of the silicon wafer 1. For example, in the resist film coating step S10, a spin coating apparatus 2 is used, and the liquid resin is applied to the front surface 1a of the silicon wafer 1 by a spin coating method. The spin coating apparatus 2 includes a rotating table 2a capable of fixing the frame unit 11 including the silicon wafer 1 on an upper surface thereof and an ejection nozzle 4 capable of ejecting a liquid resin 4a while reciprocally moving in a plane parallel to the upper surface of the rotating table 2a on the upper side of the rotating table 2a.

In the resist film coating step S10, first, the frame unit 11 is fixed to the rotating table 2a of the spin coating apparatus 2, and the front surface 1a of the silicon wafer 1 is exposed to the upper side. Next, the rotating table 2a is rotated to rotate the silicon wafer 1, and while the ejection nozzle 4 is being reciprocally moved on the upper side of the rotating table 2a, the liquid resin 4a as a material of the resist film 13 is supplied from the ejection nozzle 4 to the front surface 1a of the silicon wafer 1. In this way, the front surface 1a of the silicon wafer 1 can be coated with the resist film 13. For example, as the resist film 13, a water-soluble resin containing polyvinyl alcohol may be used, and the "HOGOMAX" (registered trademark) series produced by DISCO Corporation may be used. It is to be noted, however, that the resist film 13 is not limited to this, and a photosensitive resin preferably used for a photolithography step and the like may also be used. In addition, the film forming method for the resist film is not limited to the spin coating method, and the resist film 13 may be formed by a printing method or the like.

Figure 3:
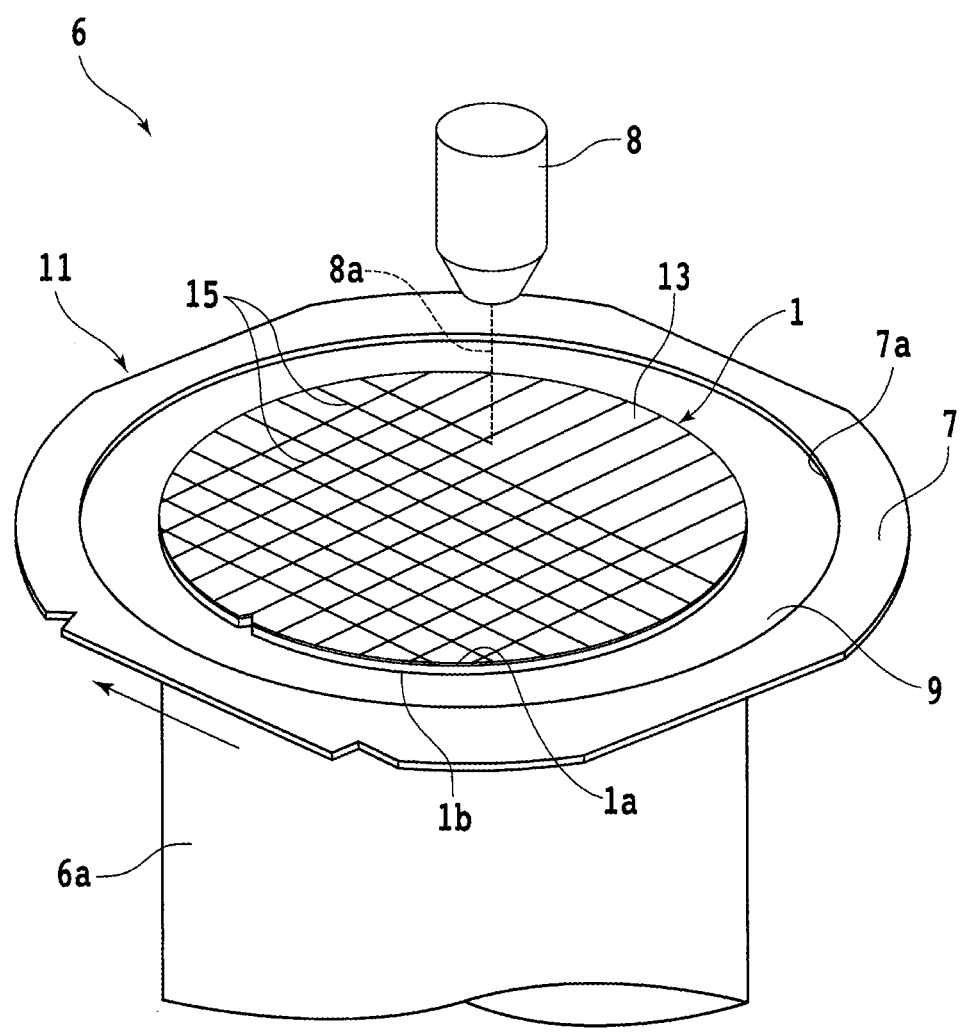
FIG. 3 is a perspective view schematically depicting an exposing step.

Subsequent to the resist film coating step S10, an exposing step S20 in which the resist film 13 is removed in regions along the streets 3 to expose the silicon wafer 1 is carried out. FIG. 3 is a perspective view schematically depicting the manner of carrying out the exposing step S20. The exposing step S20 is carried out, for example, by a laser processing apparatus 6. The laser processing apparatus 6 includes a holding table 6a to which to fix the frame unit 11 including the silicon wafer 1, and a laser processing unit 8 provided on an upper side of the holding table 6a. The laser processing unit 8 can, for example, oscillate a laser beam of such a wavelength as to be absorbed in the silicon wafer 1, and can concentrate a laser beam 8a onto the front surface 1a of the silicon wafer 1. The laser processing unit 8 and the holding table 6a can be relatively moved in a horizontal direction.

In the exposing step S20, first, the frame unit 11 is placed on the holding table 6a of the laser processing apparatus 6. Then, the laser beam 8a is concentrated onto the front surface 1a of the silicon wafer 1 by the laser processing unit 8, and the silicon wafer 1 and the laser beam 8a are relatively moved in the horizontal direction, to apply the laser beam 8a to the silicon wafer 1 along the streets 3. When the laser beam 8a reaches the front surface 1a of the silicon wafer 1, the laser beam 8a is absorbed in the silicon wafer 1, whereby the silicon wafer 1 is subjected to ablation. Then, shallow processed grooves are formed on the front surface 1a side of the silicon wafer 1 along the streets 3 by the laser beam 8a, and the resist film 13 is removed in regions overlapping with the processed grooves. Then, exposed grooves 15 are formed in the resist film 13 along the streets 3, and the front surface 1a of the silicon wafer 1 is exposed at bottoms of the exposed grooves 15. Note that, in a case where structures such as a TEG and an insulating film are formed in the regions of the front surface 1a of the silicon wafer 1 which regions overlap with the streets 3, the TEG, the insulating film, and the like may be broken and removed by the laser beam 8a.

When the exposing step S20 is carried out, a part of the silicon wafer 1, the resist film 13, and the like, which are removed, are scattered on the front surface 1a of the silicon wafer 1 and are deposited on the resist film 13. However, the resist film 13 is removed after the device chips are formed, as described later. Therefore, the deposited matter deposited on the resist film 13 is removed together with the resist film 13 and is not left on the device chips formed, so that a lowering in the quality of the device chips due to the deposited matter is not generated.

Note that the exposing step S20 is not limited to this, and the front surface 1a of the silicon wafer 1 may be exposed along the streets 3 by another technique. For example, in a case where the resist film 13 is a photosensitive resin, the resist film 13 is exposed to light and is denatured, in regions overlapping with the streets 3 or on the outside of the regions, and the resist film 13 in the regions is removed by use of a developing liquid or the like. In this case, also, the front surface 1a of the silicon wafer 1 is exposed along the streets 3. In addition, the exposing step S20 may be carried out by still another method. For example, the exposing step S20 may be carried out by a cutting apparatus including a cutting blade (not illustrated) including an annular grindstone section. When the grindstone section is brought into contact with the front surface 1a of the silicon wafer 1 along the streets 3 while the cutting blade is being rotated, the resist film 13 is cut and removed. Further, in a case where structures such as a TEG and an insulating film are formed on the front surface 1a of the silicon wafer 1 at positions overlapping with the streets 3, these structures are removed by the cutting blade.

Figure 4:
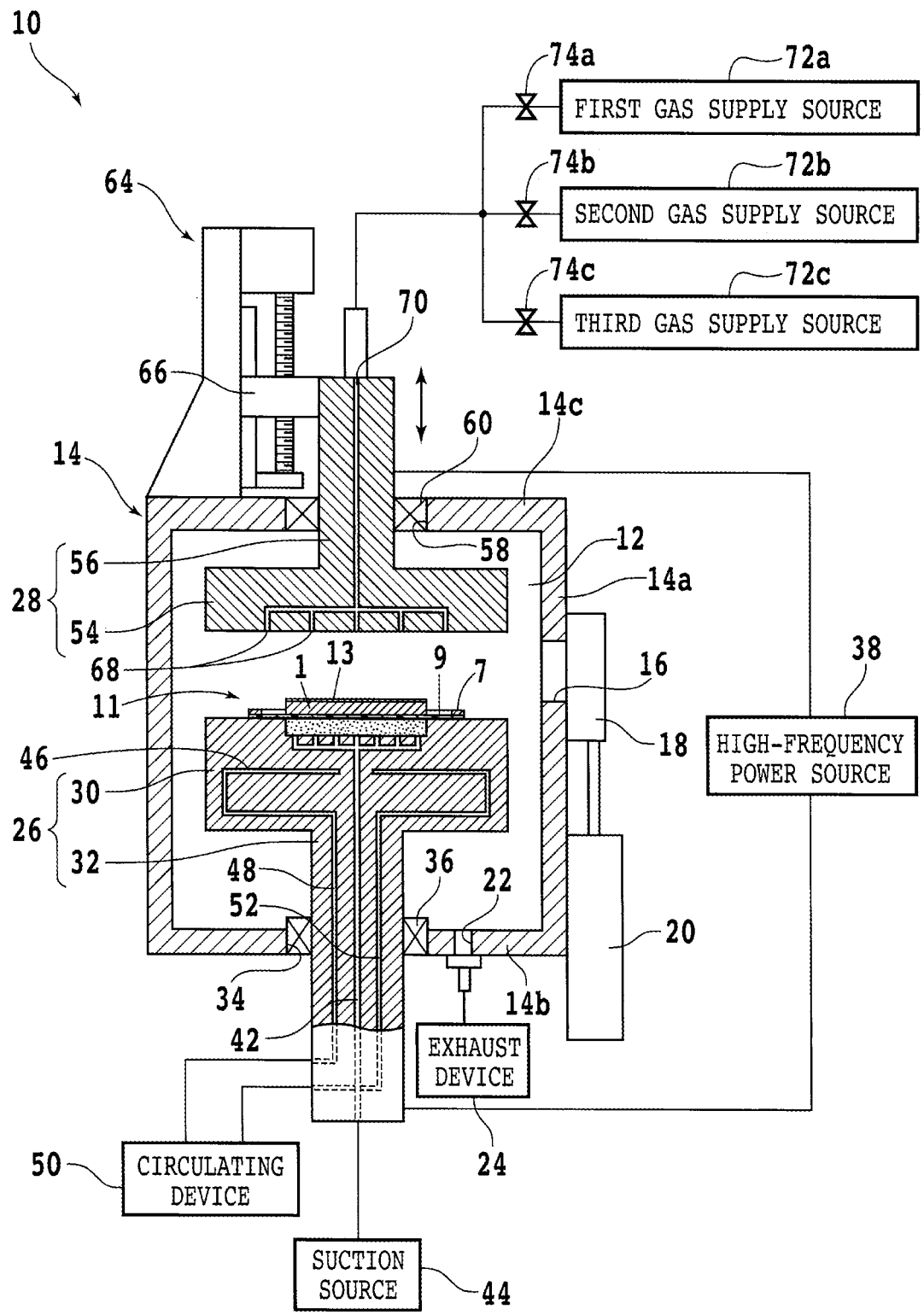
FIG. 4 is a sectional view schematically depicting a plasma treating apparatus.

Next, a silicon wafer conveying-in step S30 in which the silicon wafer 1 is conveyed into a plasma treating apparatus by which a plasma treatment is applied to the silicon wafer 1 is carried out. Here, the plasma treating apparatus used in the device chip manufacturing method according to the present embodiment will be described. FIG. 4 is a sectional view schematically depicting a plasma treating apparatus (plasma etching apparatus) 10.

The plasma treating apparatus 10 includes a vacuum chamber 14 formed therein with a treatment space 12. A side wall 14a of the vacuum chamber 14 is formed with an opening 16 through which the frame unit 11 is conveyed in and out. A gate 18 for opening and closing the opening 16 is attached to an outer portion of the opening 16. An opening-closing device 20 is provided on a lower side of the gate 18, and the gate 18 is moved upward and downward by the opening-closing device 20. When the gate 18 is moved downward by the opening-closing device 20 to open the opening 16, the frame unit 11 (silicon wafer 1) can be conveyed into the treatment space 12 of the vacuum chamber 14 through the opening 16, or the frame unit 11 can be conveyed out of the treatment space 12.

A bottom wall 14b of the vacuum chamber 14 is formed with an exhaust port 22. The exhaust port 22 is connected to an exhaust device 24 such as a vacuum pump. A lower electrode 26 and an upper electrode 28 are disposed to face each other in the treatment space 12 of the vacuum chamber 14.

The lower electrode 26 is formed of a conductive material and includes a disk-shaped holding section 30 and a cylindrical support section 32 that extends downward from the center of a lower surface of the holding section 30. The support section 32 is inserted in an opening 34 formed in the bottom wall 14b of the vacuum chamber 14. In the opening 34, an insulating bearing 36 is disposed between the bottom wall 14b and the support section 32, and the vacuum chamber 14 and the lower electrode 26 are insulated. The lower electrode 26 is connected to a high-frequency power source 38 in the exterior of the vacuum chamber 14.

An upper surface of the holding section 30 is formed with a recess, and a table 40 on which to mount the frame unit 11 is disposed in the recess. The table 40 is provided with a suction passage (not illustrated), and the suction passage is connected to a suction source 44 through a channel 42 formed inside the lower electrode 26 and the like. In addition, the holding section 30 is formed therein with a cooling channel 46. One end of the cooling channel 46 is connected to a circulating device 50 through a coolant supply passage 48 formed in the support section 32, and the other end of the cooling channel 46 is connected to the circulating device 50 through a coolant discharge passage 52 formed in the support section 32. When the circulating device 50 is operated, a coolant flows sequentially through the coolant supply passage 48, the cooling channel 46, and the coolant discharge passage 52, to cool the lower electrode 26.

The upper electrode 28 is formed of a conductive material and includes a disk-shaped gas jetting section 54 and a cylindrical support section 56 that extends upward from the center of an upper surface of the gas jetting section 54. The support section 56 is inserted in an opening 58 formed in an upper wall 14c of the vacuum chamber 14. In the opening 58, an insulating bearing 60 is disposed between the upper wall 14c and the support section 56, and the vacuum chamber 14 and the upper electrode 28 are insulated. The upper electrode 28 is connected to the high-frequency power source 38 in the exterior of the vacuum chamber 14. In addition, an upper end portion of the support section 56 is connected to a support arm 66 of a lifting and lowering mechanism 64, and the upper electrode 28 is moved upward and downward by the lifting and lowering mechanism 64.

A lower surface of the gas jetting section 54 is formed with a plurality of gas jet ports 68. The gas jet ports 68 are connected to three gas supply sources 72a, 72b, and 72c through a channel 70 and the like. As a result, raw material gases for plasma treatment can be supplied into the treatment space 12 in the vacuum chamber 14. The first gas supply source 72a can supply a $CF_4$ gas or an $SF_6$ gas and is connected to the channel 70 through a first valve 74a. The second gas supply source 72b can supply a $C_4F_8$ gas and is connected to the channel 70 through a second valve 74b. The third gas supply source 72c can supply a mixed gas of $SF_6$ and $O_2$ and is connected to the channel 70 through a third valve 74c.

In the silicon wafer conveying-in step S30, first, the gate 18 is lowered by the opening-closing device 20. Next, the frame unit 11 (silicon wafer 1) is conveyed into the treatment space 12 of the vacuum chamber 14 through the opening 16 and is mounted on the table 40 of the lower electrode 26. In this instance, the silicon wafer 1 is set facing the upper electrode 28. In addition, at the time of conveying in the frame unit 11, the upper electrode 28 is preliminarily lifted by the lifting and lowering mechanism 64, to secure a conveying-in space for the frame unit 11. Thereafter, a negative pressure of the suction source 44 is made to act, to fix the silicon wafer 1 onto the table 40 through the sheet 9. In addition, the gate 18 is lifted by the opening-closing device 20, to hermetically seal the treatment space 12. Further, the upper electrode 28 is lowered by the lifting and lowering mechanism 64 such that the lower electrode 26 and the upper electrode 28 are put into a predetermined positional relation suitable for etching. In addition, the exhaust device 24 is operated to bring the treatment space 12 to a vacuum (low pressure). Besides, an inert gas such as argon gas may be supplied into the treatment space 12 from an inert gas supply source (not illustrated) or the like.

Next, a deep groove forming step S40 is carried out. In the deep groove forming step S40, isotropic etching using a plasma of a $CF_4$ gas or an $SF_6$ gas and coating of regions exposed by the isotropic etching with a passivation film by use of a plasma of a $C_4F_8$ gas are alternately repeated. As a result, the silicon wafer 1 is processed along the streets 3, to form the silicon wafer 1 with deep grooves not reaching the back surface 1b of the silicon wafer 1. In other words, the deep grooves are formed by what is generally called the Bosch process.

In performing the isotropic etching in the deep groove forming step S40, the first valve 74a is controlled to supply a raw material gas ($CF_4$ gas or $SF_6$ gas) from the gas supply source 72a into the inside of the treatment space 12 at a predetermined flow rate. In this instance, the other valves 74b and 74c are kept closed. When predetermined high-frequency electric power is supplied between the lower electrode 26 and the upper electrode 28 by the high-frequency power source 38 in this state, a plasma is generated between the lower electrode 26 and the upper electrode 28. As a result, the front surface 1a side of the silicon wafer 1 is subjected to isotropic etching, and grooves along the streets 3 are formed in the front surface 1a of the silicon wafer 1. Here, the etching depth by one time of isotropic etching is significantly small as compared to the thickness of the silicon wafer 1.

In coating the regions exposed by the isotropic etching with the passivation film in the deep groove forming step S40, the second valve 74b is controlled to supply a raw material gas ($C_4F_8$ gas) for the passivation film from the gas supply source 72b into the inside of the treatment space 12 at a predetermined flow rate. In this instance, the other valves 74a and 74c are kept closed. When predetermined high-frequency electric power is supplied between the lower electrode 26 and the upper electrode 28 by the high-frequency power source 38 in this state, a plasma is generated between the lower electrode 26 and the upper electrode 28. As a result, a passivation film formed from a fluorocarbon polymer film or the like is formed in side walls and bottom portions of the grooves exposed by the isotropic etching, from the raw material gas in the plasmatized state. Note that, in each of the drawings, the passivation film is omitted. Next, the isotropic etching is again performed. Since the etching rate of the passivation film at the bottom portions of the grooves is higher than that at the side walls of the grooves, the silicon wafer 1 is again exposed at the bottom portions of the grooves and is etched.

Figure 5A:
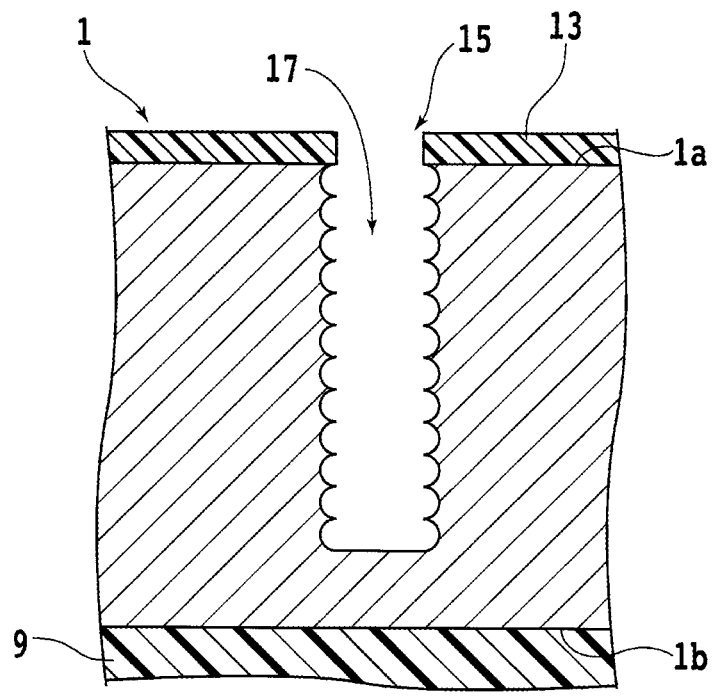
FIG. 5A is a sectional view schematically depicting, in enlarged form, the silicon wafer formed with deep grooves.

In the deep groove forming step S40, the isotropic etching and formation of the passivation film are repeated in this way, and thus, deep grooves not reaching the back surface 1b of the silicon wafer 1 are formed in the silicon wafer 1. FIG. 5A is a sectional view schematically depicting, in enlarged form, the silicon wafer 1 formed with deep grooves 17. For example, in a case where the thickness of the silicon wafer 1 is on the order of 110 µm, it is favorable that the thickness of the resist film 13 formed in the resist film coating step S10 is on the order of 2 µm. Then, it is recommendable that the thickness of the silicon wafer 1 left at lower portions of the deep grooves 17 in the deep groove forming step S40 is in the range of 10 to 50 µm.

Note that, in dividing the silicon wafer 1, it may be contemplated to continue the Bosch process, to cause the bottom portions of the deep grooves 17 to reach the back surface 1b of the silicon wafer 1, to thereby divide the silicon wafer 1 by the deep grooves 17. In this case, the back surface 1b of the silicon wafer 1 is dug through by the isotropic etching. When the back surface 1b of the silicon wafer 1 is dug through by the isotropic etching, a defect called chipping is liable to be formed at an edge of the deep grooves 17 on the back surface 1b side. The chipping would remain at an edge of a bottom surface of the device chip formed by division of the silicon wafer 1, causing a lowering in the quality of the device chips. In view of this, in the device chip manufacturing method according to the present embodiment, the deep grooves 17 formed by what is generally called the Bosch process are not made to reach the back surface 1b of the silicon wafer 1, and the lower side of the deep grooves 17 is etched by another method, to dig through the back surface 1b of the silicon wafer 1. In other words, in the device chip manufacturing method according to the present embodiment, after the deep groove forming step S40 is performed, a dividing step S50 in which division grooves are formed in the silicon wafer 1 to divide the silicon wafer 1 is carried out.

Figure 5B:
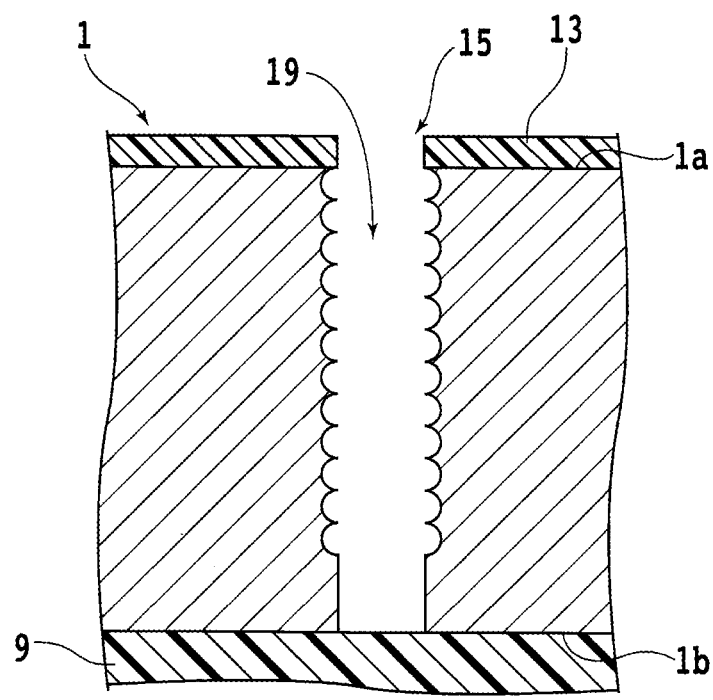
FIG. 5B is a sectional view schematically depicting, in enlarged form, the silicon wafer formed with division grooves.

The dividing step S50 is carried out by the plasma treating apparatus 10, subsequent to the deep groove forming step S40. In the dividing step S50, bottom portions of the deep grooves 17 are subjected to anisotropic etching by use of a plasma of a mixed gas of $SF_6$ and $O_2$, to form division grooves 19 reaching the back surface 1b of the silicon wafer 1, thereby dividing the silicon wafer 1 into individual device chips. In the dividing step S50, the third valve 74c is controlled to supply a raw material gas for etching (a mixed gas of $SF_6$ and $O_2$) from the gas supply source 72c into the inside of the treatment space 12 at a predetermined flow rate. In this instance, the other valves 74a and 74b are kept closed. When predetermined high-frequency electric power is supplied between the lower electrode 26 and the upper electrode 28 by the high-frequency power source 38 in this state, a plasma is generated between the lower electrode 26 and the upper electrode 28. As a result, the silicon wafer 1 is subjected to anisotropic etching from the front surface 1a side, and the silicon wafer 1 is removed on the lower side of the deep grooves 17 formed in the silicon wafer 1. In other words, the deep grooves 17 are further dug, whereby the division grooves 19 reaching the back surface 1b from the front surface 1a of the silicon wafer 1 are formed. FIG. 5B is a sectional view schematically depicting, in enlarged form, the silicon wafer 1 formed with the division grooves 19.

In this way, in the device chip manufacturing method according to the present embodiment, the back surface 1b side of the silicon wafer 1 is dug through not by isotropic etching but by anisotropic etching. In the case where the back surface 1b is dug through by the anisotropic etching, chipping is not liable to be formed at an edge of the division grooves 19 on the back surface 1b of the silicon wafer 1. Therefore, when the division grooves 19 along the streets 3 are formed in the silicon wafer 1 and individual device chips are formed, chipping is not left at the edges of the device chips, so that a lowering in the quality of the device chips is prevented.

After the dividing step S50 is carried out, the frame unit 11 is conveyed out of the plasma treating apparatus 10. Since the device chips formed by dividing the silicon wafer 1 are continuedly fixed on the sheet 9, the device chips are not scattered. In conveying out the device chips in the state of the frame unit 11, the valves 74a, 74b, and 74c of the plasma treating apparatus 10 are closed, the operation of the exhaust device 24 is stopped, and the inside of the treatment space 12 is returned to normal pressure. Next, the lower electrode 26 and the upper electrode 28 are spaced away from each other for easily conveying out the frame unit 11, and the gate 18 is lowered by the opening-closing device 20. Then, the frame unit 11 (silicon wafer 1) is conveyed out of the treatment space 12 of the vacuum chamber 14 through the opening 16.

Thereafter, the frame unit 11 is conveyed into a cleaning device (not illustrated), and the frame unit 11 is cleaned. For example, in a case where the resist film 13 is a water-soluble resin, water is supplied to the front surface 1a of the silicon wafer 1 (device chips) by the cleaning device, to remove the resist film 13. The cleaning device includes a holding table that holds the individual device chips formed from the silicon wafer 1 through the sheet 9, and an ejection nozzle that ejects a cleaning liquid to the device chips held on the holding table. Note that, for example, the cleaning liquid may be pure water or a mixed fluid of high-pressure air and pure water. Then, the holding table is rotated around an axis along a direction perpendicular to an upper surface thereof, and the cleaning liquid is jetted from the ejection nozzle onto the holding table, whereby the resist film 13 is removed and the individual device chips are obtained.

Note that, in a case where the resist film 13 is not a water-soluble resin, it is favorable that the resist film 13 is removed from the device chips by another method. For example, a resist stripping solution may be supplied to the silicon wafer 1 (device chips) to remove the resist film 13. Alternatively, before the frame unit 11 is conveyed out from the plasma treating apparatus 10, the resist film 13 may be removed by asking in which oxygen gas is reacted with the resist film 13.

The individual device chips left on the sheet 9 are thereafter picked up from the sheet 9, to be mounted on a predetermined object. In picking up the device chip from the sheet 9, the sheet 9 may be expanded in a direction of the outer periphery to enlarge the distances between the device chips, for facilitating the work.

Note that the present invention is not limited to the description of the above embodiment and can be carried out with various modifications. For example, in the above embodiment, the case where the laser beam 8a is applied to the front surface 1a of the silicon wafer 1 in the exposing step S20 to form the exposed grooves 15 in the resist film 13 and to remove the TEG and the like formed on the front surface 1a of the silicon wafer 1 has been described. However, an aspect of the present invention is not limited to this. For example, in the exposing step S20, the resist film 13 may be cut by a cutting blade along the streets 3 to form the exposed grooves 15 in the resist film 13, and thereafter, the laser beam 8a may be applied to the front surface 1a of the silicon wafer 1 exposed at the exposed grooves 15. In this case, the TEG and the like formed on the front surface 1a are removed by the laser beam 8a.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device chip manufacturing method for dividing a silicon wafer formed with devices in each of regions of a front surface partitioned by a plurality of mutually intersecting streets, into individual device chips, the device chip manufacturing method comprising:
   a resist film coating step of coating the front surface of the silicon wafer with a resist film;
   an exposing step of removing the resist film in regions along the streets to expose the silicon wafer;
   a silicon wafer conveying-in step of conveying the silicon wafer into a plasma etching apparatus;
   a deep groove forming step of alternating a plurality of times between isotropic etching using a plasma of a $CF_4$ gas or an $SF_6$ gas and coating of regions exposed by the isotropic etching with a passivation film by use of a plasma of a $C_4F_8$ gas to process the silicon wafer along the streets, thereby forming deep grooves not reaching a back surface of the silicon wafer; and
   a dividing step of subjecting bottom portions of the deep grooves to anisotropic etching by use of a plasma of a mixed gas of $SF_6$ and $O_2$ to form division grooves reaching the back surface of the silicon wafer, thereby dividing the silicon wafer into the individual device chips.

2. The device chip manufacturing method according to claim 1, wherein the resist film is a water-soluble resin containing polyvinyl alcohol.

3. The device chip manufacturing method according to claim 1,
   wherein a test element group and an insulating film overlapping with the streets are formed on the front surface of the silicon wafer, and,
   in the exposing step, a laser beam is applied to remove the resist film, the test element group, and the insulating film in regions overlapping with the streets.

4. The device chip manufacturing method according to claim 1,
   wherein a test element group and an insulating film overlapping with the streets are formed on the front surface of the streets, and,
   in the exposing step, the resist film, the test element group, and the insulating film are removed in regions overlapping with the streets by use of a cutting blade.

* * * * *